United States Patent [19]

Milshtein

[11] 4,005,523
[45] Feb. 1, 1977

[54] SEMICONDUCTOR DEVICES

[76] Inventor: Samson Khaim Milshtein, 84/33 Hantke St., Jerusalem, Israel

[22] Filed: Sept. 9, 1975

[21] Appl. No.: 611,801

[30] Foreign Application Priority Data

Apr. 9, 1975    Israel .................................... 47059

[52] U.S. Cl. .................................. 29/581; 29/580; 29/590; 148/1.5
[51] Int. Cl.² ......................................... B01J 17/00
[58] Field of Search .................... 29/580, 581, 590; 228/179; 148/1.5

[56] References Cited

UNITED STATES PATENTS

| | | | |
|---|---|---|---|
| 2,840,495 | 6/1958 | Treuting ............................ | 148/1.5 |
| 2,948,642 | 8/1960 | MacDonald ........................ | 29/590 |
| 3,252,203 | 5/1966 | Alberts .............................. | 228/179 |

*Primary Examiner*—W. Tupman
*Attorney, Agent, or Firm*—Weingarten, Maxham & Schurgin

[57] ABSTRACT

A process for the production of p-n junctions which comprises preparing a suitable silicon type-n crystal of 100Ω/cm to several kΩ/cm with the orientation (111), (112) and (110), heating the crystal to a temperature of between 700° C and 800° C, and applying to the (111) surface a load of from 0.5 kg to 1.2 kg during a period of time of from 5 to 50 seconds by means of a suitable pointed instrument, removing the load and welding the thus produced dislocation region to a suitable conductor. Advantageously the silicon crystal is chemically polished after the deformation, and the welding is advantageously effected by pressing a metal wire of an inert metal to the dislocation region and applying to same a tungsten electrode, the wire being the second electrode, the welding being effected by condenser welding.

10 Claims, 2 Drawing Figures

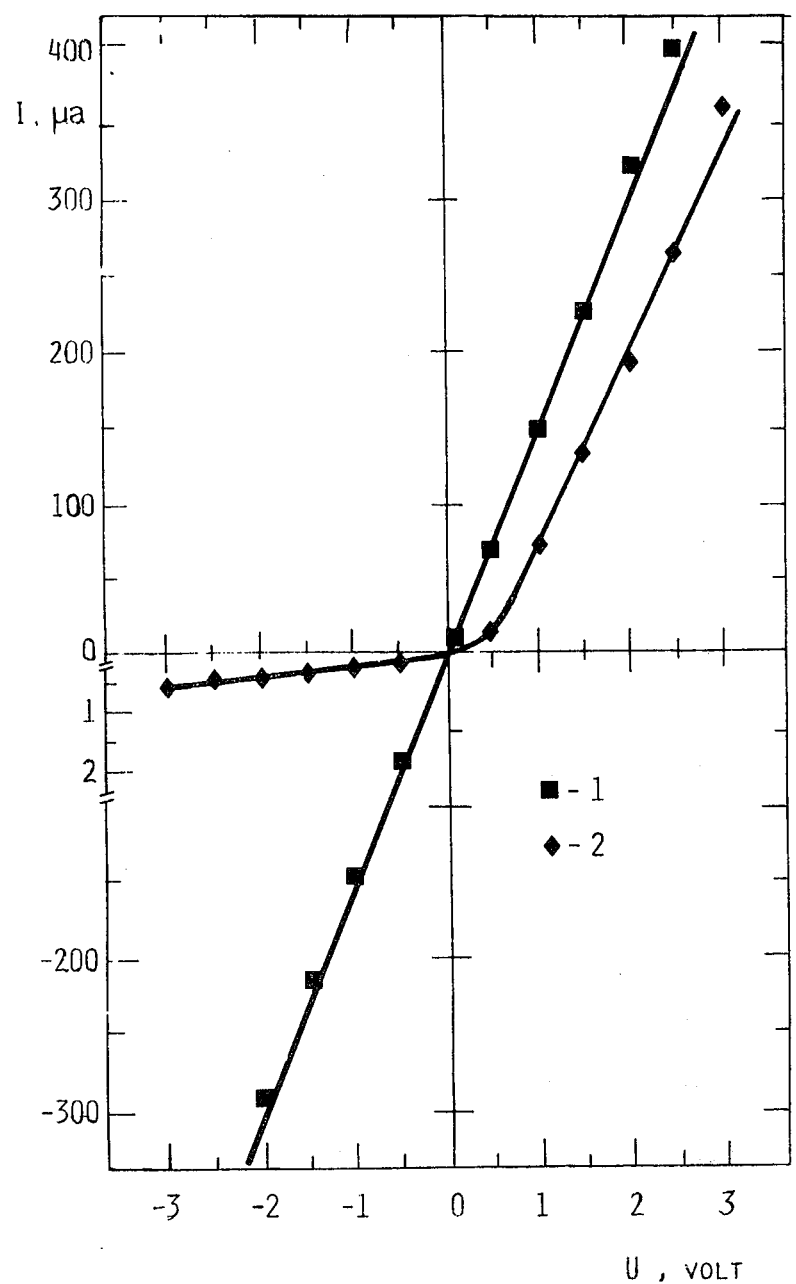
FIGURE NO. 1

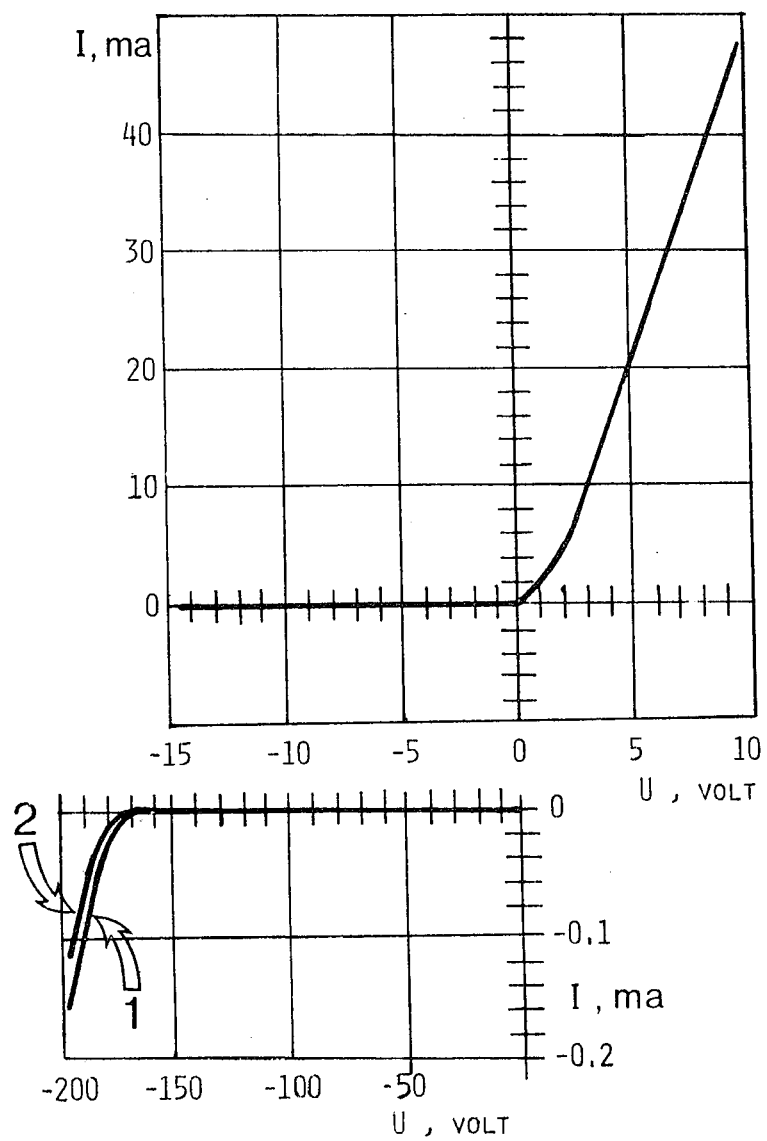
FIGURE NO. 2

SEMICONDUCTOR DEVICES

BACKGROUND OF THE INVENTION

A method of creating p-n junctions based on dislocation planes of grain boundaries is described in U.S. Pat. No. 2,970,229. This process is based on the introduction of a comparatively high number of dislocations per unit area by a process of growth of bicrystals. The process has the inherent drawback of difficulties in the separation of undesired side-effects due to pointdefects and impurities which is apt to change the type of conductivity in the grain boundary areas. The known process requires a rather complicated technology and the control of various parameters, such as forms and dimensions of the p-n junctions is quite complicated.

There has also been described a process of forming p-n junctions by indentation pressing, described by the inventor of the present invention in his Russian Pat. No. 348129. According to the process described in this Russian patent it is possible to obtain clusters of a maximum density of about $10^7$ to $10^8$ cm$^{-2}$. The p-n junctions of the known process have the disadvantage of electrical breakdown at comparatively low voltages (about 30 V), and also the area of the p-n junction is comparatively small, which limits the possible working power.

The semiconductor devices of the present invention have substantially improved characteristics, and they are especially advantageous as regards their temperature stability, that they recover after electrical and after thermal breakdowns, and that they are stable under the influence of radioactive radiation. The novel junctions are stable under comparatively high voltages; the technology of formation is a comparatively simple one and it is one of the outstanding advantages of the invention that no additional materials are necessary (for diffusion or the like). The novel method of attachment of the required conductors is also a feature of the present invention.

BRIEF SUMMARY OF THE INVENTION

The novel semiconductor devices are formed by preparing a silicon n-type wafer with (111), (112) (110) orientation, of about 100 ohm/cm to several kilo-$\Omega$/cm which was chemically polished. The working face was (111), and the desired dislocations are formed by applying a predetermined pressure by means of a shaped identor at a predetermined elevated temperature so as to obtain the desired deformation, after which the pressure is removed, and the crystal is subjected to a chemical treatment, to etching and after this the necessary electrical conductor is attached by welding. The results are reproducible and there can easily be produced a plurality of such dislocation regions, one after the other, on the same substrate crystal.

The welding is advantageously effected in such manner so as to avoid local overheating and so as to avoid to a large extent the diffusion of the contact material into the sample. This welding process is effected by applying a wire suitable metal, such as gold, bent at its end so as to form a V, the contact being established at the apex of the V, and this wire forms one of the electrodes, the other being a tungsten wire or needle. When the tungsten needle touches the gold wire, a shortening takes place and the bent tip melts, the fused drop solidifying on the contact spot making a firm bond with the silicon substrate at the dislocation position. In this manner the flow of current thorugh the silicon wafer is obviated.

DESCRIPTION OF A PREFERRED EMBODIMENT:

A single crystal silicon, n-type, was cut in the form of a wafer of 1.5 × 2.5 × 25 mm with orientations (111), (112) (110), the prism face designations being given in the order of decreasing areas. The working face of the crystal was the (111) face. The sample was positioned in a circular oven of 40 mm internal diameter and of 55 mm height, which was positioned on a manipulator stage, providing the possibility of motion in a plane in two directions by means of micrometers. The sample was put on a heatresistant support, with the work-face facing upwards and the temperature was adjusted and measured by a thermocouple to within −2.5° C. A silicon-carbide identor, with a tapered end in the form of a four-faced pyramide was applied from above, perpendicular to the work-face. This was weighed down on the face of the crystal at a predetermined pressure, and was left in place for a given period of time. It was found that good results could be obtained at a temperature of 750° C. This temperature can be varied from about 700° to 800° C. The load applied was 0.8 kg., and this can be varied between about 0.5 kg to about 1.2 kg. The load was applied for about 10 sec. At lower temperatures and pressures longer times are required. After this, the silicon wafer can be moved by a predetermined distance, such as about 1 mm, and the process of forming dislocations can be repeated in the same manner until a row or sequence of rows of such indentations is obtained. After removal of the silicon wafer from the stage it is advantageously subjected to a chemical polishing with a mixture of hydrofluoric acid to nitric acid of 1:7 by volume during about 5 minutes. After this the sample is subjected to chemical etching by means of hydrofluoric acid/nitric acid/acetic acid (conc.)1:3:)3 during about 3 minutes. The dislocation density was measured with an optical microscope in the region of the indentations and this was found to be at least $10^8$ cm$^{-2}$, plurally between $10^{10} - 10^{11}$.

A gold wire of 0.1 to 0.15 mm diameter was bent at a sharp angle at its end, so as to obtain a section of 0.5 to 1 mm length. The tip of the V was applied to the identated spot and the gold wire was connected to a voltage source, the other end of which was connected to a tungsten needle. Upon touching the gold wire, the current brings about a melting of the gold, and the formation of a fused drop of gold, which adheres well to the silicon substrate.

The dislocation regions thus produced were tested at room temperature by the thermoprobe method and it was shown that the conductivity was inverted in the deformed parts of the n-type silicon crystal. This was observed only at the center of the dislocation where the density of dislocations is high. When the probe was displaced to a region of lower dislocation density, this inversion disappeared.

The results are illustrated with reference to the enclosed drawings, in which:

FIG. 1 is a graphic representation of current versus voltage;

FIG. 2 is a graphic representation of current versus voltage illustrating the rectification and breakdown voltage of devices according to the invention.

As shown in FIG. 1, 1 designates the currentvoltage characteristic of gold-ohmic contacts, of current passing via gold contacts welded to the substrate in areas free of dislocations. 2 shows the current-voltage relation measured via gold contacts welded to the area of dislocations and to an area free of such dislocations.

FIG. 2, a upper graph, illustrates the currentvoltage relation at the dislocation p-n junction while the lower graph shows the voltage (about 170 V) at which a breakdown starts. The two lines indicated values obtained during different measurements. The breakdown voltage of about 170–175 V is appreciably higher than that of similar devices with dislocation clusters of lower density. The p-n junctions recover after such voltage breakdowns, as evident from FIG. 2, second graph, and they recover also after thermal breakdowns. Such junctions are not influenced by radioactive radiation to any appreciable degree, with the exception of neutrons.

Many of the conventional p-n junctions produced commercially are based on alloyed or on diffusion junctions. When breakdowns take place in such junctions, the solid-solution zones or the eutectic regions are disrupted at fairly low temperatures. The ability of the p-n junctions according to the present invention to recover after breakdowns is due to the fact that for a change of dislocation structure, density or of the dislocation boundaries, the combined action of elevated temperature and of pressure is required. Heat alone in only effective at quite high temperatures, in the vicinity of the melting point of silicon.

The location of the p-n junction interface was determined by deforming thin (0.2 mm) crystals along the 111 direction, so that a column-shaped dislocation region ran across the cyrstal. Gold contacts were welded at the opposite ends of the dislocation region, and symmetric linear characteristics were obtained. Thus it is clear that the interface between the gold contacts and the deformed region does not cause the current rectification, which actually takes place when the current passes across the interface between the deformed region and the normal crystal region. The dislocation density was calculated on the basis of band-theoretical concepts and was found to be of the order of $10^{11}$ cm$^{-2}$. This high density can only be obtained by the combination of high temperatures and by the comparatively high pressure. The breakdown voltage is about 175– 200 V, and thus this is appreciably higher than the values obtained hitherto. Normal semiconductor devices deteriorate when exposed to certain radioactive radiations. This is not the case with the semiconductors prepared according to the present invention.

The novel semiconductor devices according to the present invention can be advantageously used as electronic elements. They can be used as diodes, as HF-diodes (in the cm range), as diode matrix. As is evident from the enclosed drawing, (FIG. 1), the current intensity in one direction is greater from that in the reverse direction by three orders of magnitude. The devices are heat-stable, recover after electrical or thermal breakdowns. It is again stressed that no doping is used and that the device comprises only the silicon crystal without any foreign elements.

It is clear that the above description is by way of illustration only and that many changes and variations in the detail of the process of production can be resorted to without departing from the scope of the present invention.

I claim:

1. A process for the production of p-n junctions which comprises preparing a suitable silicon type-n crystal of 100Ω/cm to several KΩ/cm with the orientation (111), (112) and (110), heating the crystal to a temperature of between 700° and 800° C, and applying to the (111) surface a load of from 0.5 to 1.2 kg. during from 5 to 50 seconds by means of a suitable pointed instrument, removing the load and welding the thus produced dislocation region to a suitable conductor.

2. A process as claimed in claim 1, wherein the temperature is about 740°–760° C and the load is about 0.7–1.0 kg.

3. A process according to claim 1, where the silicon crystal is chemically polished after deformation.

4. A process according to claim 3, wherein the crystal is subjected to a chemical etching step after the chemical polishing step.

5. A process according to claim 4, wherein the polishing is effected in an HF/HNO$_3$ mixture.

6. A process according to claim 5, wherein the etching is effected in a mixture of HF/HNO$_3$/CH$_3$COOH.

7. A process according to claim 1, wherein the electrical conductor is attached to the dislocation region by condenser welding.

8. A process according to claim 7, where the welding is effected by pressing a metal wire of a suitable metal against the dislocation region and by applying to same a tungsten electrode, the wire being the second electrode.

9. A process according to claim 7, wherein the wire is bent at a sharp angle for a distance of from 0.5 to 1.5 mm before welding.

10. A process according to claim 1, where the combination of temperature and pressure is chosen in such a manner that a dislocation density of $10^{10}$ to $10^{11}$/cm$^2$ is obtained.

* * * * *